United States Patent
Bürke et al.

(10) Patent No.: US 6,602,788 B2
(45) Date of Patent: Aug. 5, 2003

(54) PROCESS FOR FABRICATING AN INTERCONNECT FOR CONTACT HOLES

(75) Inventors: Axel Bürke, Dresden (DE); Jens Hahn, Dresden (DE); Sven Schmidbauer, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/894,942

(22) Filed: Jun. 28, 2001

(65) Prior Publication Data

US 2002/0006720 A1 Jan. 17, 2002

(30) Foreign Application Priority Data

Jun. 28, 2000 (DE) .......................... 100 32 792

(51) Int. Cl.⁷ ................ H01L 21/44; H01L 21/4763; H01L 21/31
(52) U.S. Cl. .................. 438/688; 438/627; 438/637; 438/639; 438/643; 438/685; 438/783; 438/632; 438/660
(58) Field of Search ................ 438/688, 783, 438/685, 633, 627, 632, 660, 636–640, 643

(56) References Cited

U.S. PATENT DOCUMENTS

| | | |
|---|---|---|
| 4,970,176 A | 11/1990 | Tracy et al. |
| 5,691,571 A | 11/1997 | Hirose et al. ............ 257/751 |
| 5,776,827 A | 7/1998 | Hibino et al. |
| 5,789,317 A | 8/1998 | Batra et al. ............ 438/642 |
| 5,856,026 A | 1/1999 | Joshi et al. ............ 428/620 |
| 5,980,657 A | 11/1999 | Farrar et al. ............ 148/438 |
| 6,110,829 A | 8/2000 | Besser et al. |
| 6,162,729 A * | 12/2000 | Kuno et al. |
| 6,225,218 B1 * | 5/2001 | Yamazaki et al. |

FOREIGN PATENT DOCUMENTS

| | | |
|---|---|---|
| JP | 04 209 572 A | 7/1992 |
| WO | WO 94/19826 | 9/1994 |

OTHER PUBLICATIONS

K. Kikuta et al.: "Aluminum–Germanium–Copper Multi-level Damascene Process using Low Temperature Reflow Sputtering and Chemical Mechanical Polishing", IEDM 94, pp. 101–104.

Kuniko Kikuta et al.: "Aluminum–Germanium–Copper Multilevel Damascene Process Using Low–Temperature Reflow Sputtering and Chemical Mechanical Polishing", IEEE Transactions on Electron Devices, vol. 43, No. 5, May 1996, pp. 739–745.

* cited by examiner

Primary Examiner—Ha Tran Nguyen
(74) Attorney, Agent, or Firm—Laurence A. Greenberg; Werner H. Stemer; Ralph E. Locher

(57) ABSTRACT

A process for fabricating an interconnect for contact holes includes forming contact holes in an insulation layer leading to a first interconnect layer, cleaning the hole surface, forming a barrier layer on the hole surface, forming an AlGeCu-containing second interconnect layer on the insulation surface by a low-temperature PVD process to fill up the contact holes, forming and patterning a mask layer, and patterning the second interconnect layer by an anisotropic etching process using the mask layer. Due to the relatively small grain sizes and precipitations that are formed in the process, the layer can be patterned directly in a subsequent patterning step, resulting in an extremely reliable and inexpensive interconnect that is easy to integrate in existing process sequences.

19 Claims, 1 Drawing Sheet

PROCESS FOR FABRICATING AN INTERCONNECT FOR CONTACT HOLES

BACKGROUND OF THE INVENTION

Field of the Invention

The invention relates to a process for fabricating an interconnect for contact holes and, in particular, to a process for the simple and inexpensive fabrication of an interconnect with contact holes that are free of disruptive voids.

The increasing complexity of integrated circuits and the rising packing density is, on one hand, increasing the number of interconnect or metallization layers of an integrated circuit while, on the other hand, a pattern size of contact holes for providing contact between the interconnect levels is decreasing. The contact holes serve to provide an electrical connection between the different interconnect levels or a substrate level on which electric circuits are formed. Filling up these contact holes or vias without producing voids and the simple patterning of the following interconnect level represents a key problem in the fabrication of an interconnect of an integrated circuit or a chip.

For example, the deposition of metal of upper metallization levels (second, third levels, etc.) often causes material to accumulate at the top edges of the contact hole or via, and such accumulation may even lead to deposition in the lower region of the contact hole becoming blocked and, therefore, to form what are referred to as voids. The problem increases with the progressively greater packing density or reduction in diameters for the contact holes and the tendency towards increasingly steep side walls of the contact holes in future size reduction processes, referred to as shrinks.

To fabricate such finely patterned contact holes with high aspect ratios in multiple interconnect levels, it has been customary to employ the four fabrication processes described below.

In what is referred to as a W-CVD process, tungsten is formed in the contact holes using a chemical vapor deposition (CVD) process, the process being distinguished by a good filling performance even with very small dimensions. However, such type of tungsten contact holes entail a large number of drawbacks that militate against using the process for the simple and inexpensive fabrication of an interconnect for contact holes. On one hand, there is a risk of an etching attack on a semiconductor substrate used from the $WF_6$ used during the fabrication. Furthermore, tungsten exhibits poor adhesion to $SiO_2$ and, consequently, causes possible contact problems. In particular, however, the heterogeneity of materials between tungsten contact holes and the respective metallization layers of the various interconnect levels, which preferably are made of Al alloys, cause differences in material flow. The differences in material flow lead to the preferential formation of voids at the interface between the tungsten contact holes and the metallization due to electromigration and stress migration. As such, the service life of the entire chip is impaired. Furthermore, the relatively high contact resistance compared to that of metallization levels or interconnect levels militates against the use of tungsten vias especially in future shrinks.

As an alternative to the tungsten deposition described above, it is possible to use chemical vapor deposition of an aluminum metallization (Al-CVD). However, the low deposition rates have meant that Al-CVD processes have been unable to gain acceptance for the mass production of integrated semiconductor circuits or chips. Furthermore, the high temperatures of $\geq 500$ degrees Celsius during the deposition lead to very large grains and associated difficulties in the subsequent patterning. Also, the Al-CVD process cannot be used to produce an alloy, such as, for example, Al-0.5% Cu, of the required quality. Therefore, such a process cannot be used for the simple and inexpensive fabrication of an interconnect.

A further possibility for the fabrication of contact holes or vias without voids is offered by what is referred to as the Al-PVD (physical vapor deposition) sputtering process at high temperatures of $\geq 500$ degrees Celsius. One modification to the physical vapor deposition process is in an initial cold deposition for the nucleation of Al nuclei and a subsequent increase in temperature during the sputtering. Although it is possible to achieve a good filling performance, with an improved reliability compared to that achieved using tungsten contact holes, the high temperatures during deposition of $\geq 500$ degrees Celsius means that the metallization layers or interconnect levels below are damaged by thermo-mechanical stress. Furthermore, very thick adhesion layers of Ti are required for filling gaps and voids by Al diffusion. This, together with the high temperature balance, leads to the formation of a pronounced $TiAl_3$ layer, thus negating the advantage of the lower resistance compared to the tungsten contact holes.

A further possibility for the fabrication of an interconnect for contact holes is what are referred to as reflow processes. In such processes, the conventional sputtering is followed by a heat treatment at an elevated temperature of preferably $\geq 500$ degrees Celsius, during which a filler material is able to flow (reflow) into contact holes or their voids that have not previously been filled. Due to its low cost and simplicity, the process is particularly effective for mass production. However, the process, like the process described above, has the drawback of the damage caused to the metallization layers or interconnect levels below as a result of the high process or reflow temperature and the additional formation of a $TiAl_3$ layer prior to patterning, with its unnecessarily high resistance. An alternative is offered by what are referred to as laser reflow processes, in which the subsequent heat treatment of the metallization or interconnect levels is controlled locally using a laser beam. Although this reduces the damage caused to lower metal levels, it does not allow inexpensive mass production.

Furthermore, for example, U.S. Pat. No. 5,789,317 to Batra et al. discloses a process in which, a sputtering deposition process is used to deposit AlGeCu in the contact holes using hydrogen (H) to fabricate an interconnect for contact holes. As such, it is possible to significantly reduce the flow properties and the risk of void formation. The use of hydrogen loosens the metal bonds and results in improved flow properties. However, because of the greatly increased roughness of the metal layer in the process, chemical mechanical polishing (CMP) has to be carried out first in a subsequent step, and a following interconnect layer that can be patterned easily and finely has to be applied to the entire area. However, these additional steps entail additional outlay, not least in terms of cost and time, with the further risk of deterioration in the contact.

SUMMARY OF THE INVENTION

It is accordingly an object of the invention to provide an interconnect for contact holes with small dimensions that overcomes the hereinafore-mentioned disadvantages of the heretofore-known devices and methods of this general type and that simply and inexpensively allows reliable contact to be formed between different interconnect levels.

With the foregoing and other objects in view, there is provided, in accordance with the invention, a process for fabricating an interconnect for contact holes, including the steps of: (a) forming contact holes in an insulation layer leading to a first interconnect layer, the insulation layer having an insulation surface, the contact holes having a hole surface; (b) cleaning the hole surface; (c) forming a barrier layer at least on the hole surface; (d) forming an AlGeCu-containing second interconnect layer on the insulation surface by a low-temperature PVD process to fill up the contact holes; (e) forming and patterning a mask layer; and (f) patterning the second interconnect layer by an anisotropic etching process using the mask layer.

In particular, the formation of an AlGeCu-containing second interconnect layer in order to fill the contact holes by a PVD process and the direct patterning of the second interconnect layer by an anisotropic etching process makes it possible to form contact holes without voids at low temperatures, so that there is no damage to lower interconnect levels or metallization layers. The formation of the intermetallic phase $TiAl_3$, with the associated patterning difficulties, is minimized as a result. The AlGeCu layer that is formed has sufficiently small grain sizes to enable direct patterning by an anisotropic etching process. Consequently, the CMP (chemical mechanical polishing) step that is usually present can be eliminated, thus, further simplifying the process.

In accordance with another mode of the invention, preferably, the second interconnect layer is formed in a single-stage process by deposition of an AlGeCu layer at substrate temperatures of >100 degrees Celsius. Usually, however, the substrate temperatures are below 420 degrees Celsius and, therefore, well below what is referred to as the reflow temperature of >500 degrees Celsius. As such, the second interconnect layer can be deposited relatively quickly in the contact holes without the formation of voids.

In accordance with a further mode of the invention, the second interconnect layer can be deposited in a two-stage process by deposition of a first AlGeCu layer at low temperatures and of a second AlGeCu layer at high substrate temperatures. Such formation results in the further improvement of the filling properties in the contact holes. Preferably, the second interconnect layer is formed in a two-stage process by depositing a first AlGeCu layer at a substrate temperature of <100 degrees Celsius and depositing a second AlGeCu layer at a substrate temperature of >100 degrees Celsius.

In accordance with an added mode of the invention, in a two-stage process the second interconnect layer can also be formed by depositing an AlCu layer at low substrate temperatures of <100 degrees Celsius and an AlGeCu layer at higher substrate temperatures of >100 degrees Celsius. The result of such a process is improved filling properties and contact resistances combined with shortened deposition times.

In accordance with an additional mode of the invention, the second interconnect layer can be formed in a three-stage process by depositing a first AlCu layer, an AlGeCu layer, and a second AlCu layer. As a result, improved contact resistances and optimum patterning properties are achieved while maintaining optimum flow properties.

In accordance with yet another mode of the invention, the second interconnect layer forming step includes subjecting the second interconnect layer including at least one of the contact holes to a final heat treatment.

In accordance with yet a further mode of the invention, the second interconnect layer is formed in a multi-stage process by depositing at least one AlGeCu layer in the contact holes, followed by planarizing by chemical mechanical polishing, and by depositing an AlCu layer over an entire area of the insulation surface.

In accordance with yet an added mode of the invention, the cleaning step is performed by wet-chemical cleaning and/or a plasma-etching process.

In accordance with yet an additional mode of the invention, the barrier layer used is preferably a Ti adhesion layer having a thickness that can be reduced further, due to the improved flow properties, therefore, allowing even smaller pattern sizes.

In accordance with again another mode of the invention, before the mask layer forming and patterning step, an antireflection layer is formed on the surface of the second interconnect layer.

In accordance with again a further mode of the invention, a TiN layer is formed as the antireflection layer.

In accordance with again an added mode of the invention, a Ge-containing AlCu target is used to form the second interconnect layer.

In accordance with a concomitant mode of the invention, the patterning step is performed by reactive ion etching. Reactive ion etching directly on the second interconnect layer is preferably employed for the anisotropic etching process, so that the process is particularly easy to integrate into existing fabrication processes.

Other features that are considered as characteristic for the invention are set forth in the appended claims.

Although the invention is illustrated and described herein as embodied in a process for the fabrication of an interconnect for contact holes with small dimensions, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
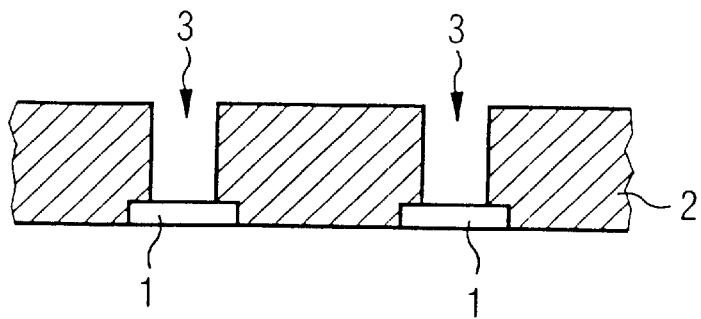
FIGS. 1 to 5 are simplified cross-sectional views of the process steps for the fabrication of an interconnect for contact holes according to the invention.

In all the figures of the drawing, sub-features and integral parts that correspond to one another bear the same reference symbol in each case.

Referring now to the figures of the drawings in detail and first, particularly to FIG. 1 thereof, a first interconnect layer 1 is situated on a non-illustrated substrate in which, for example, electronic circuits are integrated. However, the interconnect layer 1 does not have to rest directly on a substrate, but rather may also form an intermediate interconnect level above it. To provide insulation from a further interconnect level, as shown in FIG. 1, an insulation layer 2 is formed above the first interconnect layer 1. To produce an electrical connection to the first interconnect layer 1, in a subsequent process step finely patterned contact holes or vias 3 are formed in the insulation layer 2. The insulation layer 2 preferably is made of silicon dioxide, but may also be made of any other material or of a multiplicity of layers. After the contact holes 3 have been formed, preferably using an anisotropic etching process, a wet-chemical and/or plasma-chemical cleaning of the wafer surface or the contact holes 3 is carried out to clean, in particular, the side faces.

Figure 2:
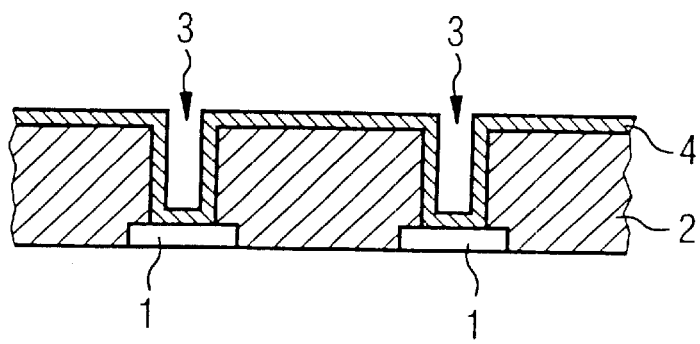

As shown in FIG. 2, in a subsequent process step a barrier layer 4 is formed at least on the surface of the contact hole 3, and preferably on the entire surface of the wafer. The barrier layer 4 preferably is a Ti adhesion layer, thus reducing a contact resistance between the first interconnect layer 1 and the following interconnect layer formed in the contact holes. The barrier layer or adhesion layer 4 may be very thin, so that it is possible to fabricate very finely patterned contact holes 3 with steep flanks.

Figure 3:
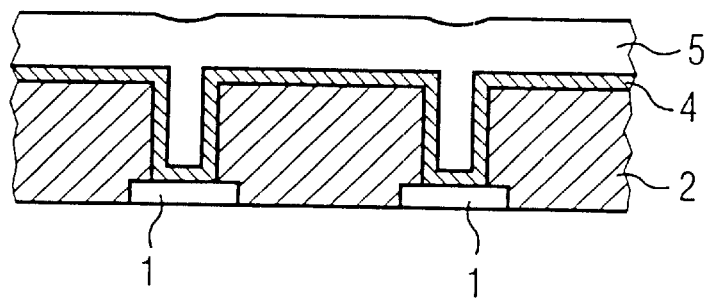

As shown in FIG. 3, in a further process step an AlGeCu-containing second interconnect layer 5 is deposited on the surface of the insulation layer 2 by a physical vapor deposition (PVD) process, resulting in filling the contact holes 3 up without voids. The temperatures used to form the AlGeCu-containing second interconnect layer 5 are well below the customary reflow temperatures of >500 degrees Celsius and preferably are below 400 degrees Celsius. Therefore, particularly due to the use of a Ge-containing AlCu target, it is possible to form an electrically conductive layer with good flow properties in the contact holes 3 at very low temperatures. Consequently, the second interconnect layer 5 has at least one layer including the alloy $Al_{(1-x-y)}Ge_xCu_y$. Because the Al—Ge phase diagram reveals a eutectic temperature of 420 degrees Celsius with 5 percent by weight Ge, it is possible, by using the low-temperature physical process, to form a metallization layer with sufficient flow properties in the contact holes 3 at temperatures that lie well below the reflow temperatures of >500 degrees Celsius and usually below 420 degrees Celsius even when using a relatively low Ge content.

Figure 4:
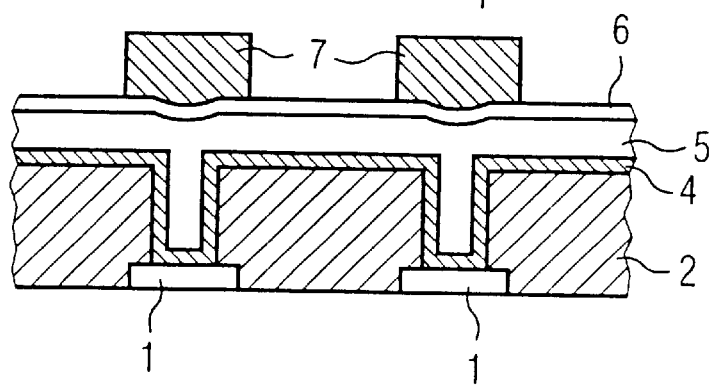

As shown in FIG. 4, in a subsequent step an antireflection layer 6 is formed on the surface of the second interconnect layer 5, allowing highly accurate patterning of the second interconnect layer. In a subsequent step, for example, a mask layer 7 is formed and patterned, preferably using photolithography processes.

Figure 5:
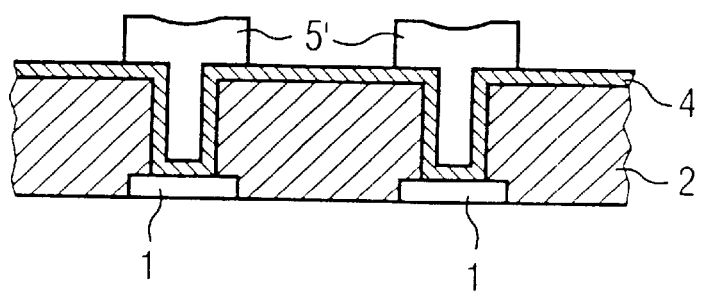

Then, as shown in FIG. 5, a second interconnect layer 5 is patterned directly, using the mask layer 7, by an anisotropic etching process so as to form a second interconnect level 5'.

Accordingly, the grain sizes of the AlGeCu-containing second interconnect layer are sufficiently small to achieve sufficiently accurate patterning due to the low-temperature PVD process described above. As a result, the CMP process with the subsequent formation of a further metallization layer that is customarily required is eliminated, without the formation of any adverse contact resistances between the metallization layer inside and outside the contact holes 3.

The result is a simple and inexpensive fabrication process with which it is possible to produce a particularly reliable interconnect for contact holes.

Various embodiments for the formation of the second interconnect layer are described below.

According to a first embodiment, an AlGeCu layer as second interconnect layer 5 is formed in a single-stage process by a PVD deposition at elevated substrate temperatures of >100 degrees Celsius in the contact holes 3 and on the surface of the insulation layer 2. It is preferable to use a PVD deposition process in which a Ge-containing target (with a homogeneous Ge distribution) is bombarded. At these substrate temperatures, which still lie well below conventional reflow temperatures of >500 degrees Celsius, improved flow properties of the new alloy $Al_{(1-x-y)}Ge_xCu_y$ are obtained. Such properties allow void-free filling of the contact holes and ensure sufficient contact between respective metallization or interconnect levels. Consequently, the material introduced can begin to flow as early as during the deposition, which is advantageous, in particular, when using very finely patterned contact holes.

Furthermore, the relatively low temperatures during the PVD deposition of less than 500 degrees Celsius means that the metallization layers below are not damaged by thermo-mechanical stress and a relatively fine-grained AlGeCu layer is formed, which layer can be patterned directly in a following anisotropic etching process. As such, an interconnect can be produced particularly quickly and easily. Consequently, CMP processes that are customarily used can be dispensed with. Furthermore, the barrier layer 4 that is formed on the surface of the contact holes 3, and preferably is made of Ti, serves to improve the contact resistance.

According to a second embodiment, the second interconnect layer 5 may alternatively be formed in a two-stage process by PVD sputtering of a first AlGeCu layer at substrate temperatures of <100 degrees Celsius and of a second AlGeCu layer at substrate temperatures of >100 degrees Celsius. Because substantially the same materials and deposition processes as in the first embodiment are used, a detailed description of these materials and processes is not given in the text that follows. Once again, for example, the AlGeCu layer is produced from a Ge-containing AlCu target with a homogeneous Ge distribution, the alloy with 5 percent by weight Ge having a eutectic temperature of approximately 420 degrees Celsius, so that the second interconnect layer can be formed at temperatures significantly below 420 degrees Celsius. The use of the two-stage process described above, in which a first, relatively thin AlGeCu layer is formed with a relatively high outlay on time and at relatively low temperatures of less than 100 degrees Celsius, followed by the formation of a second AlGeCu layer at substrate temperatures of >100 degrees Celsius, which can generally be carried out very quickly, results in a particularly reliable interconnect in which no voids whatsoever are formed in the contact holes. The AlGeCu layer formed in a two-stage process once again has a very small grain size, and, consequently, the layer can be patterned directly to form the actual interconnect in a subsequent patterning step.

According to a third embodiment, the second interconnect layer 5 is formed in a two-stage process by deposition of an AlCu layer at substrate temperatures of <100 degrees Celsius and of an AlGeCu layer at substrate temperatures of >100 degrees Celsius. The processes for the PVD of the AlGeCu layer in the fourth embodiment case once again correspond to the deposition processes described above, for which reason they are not described in detail below. To further improve deposition in the contact holes 3 and in the first interconnect layer 1, which preferably is made of AlCu, it is possible, according to the third embodiment, firstly to form an AlCu layer in a so-called cold process. On account of the low temperatures, the deposition rate is, once again, relatively slow, but the quality is improved. As in the second embodiment, the result is a further improved interconnect, which now includes two no different layers and can, once again, be patterned very successfully.

According to a fourth embodiment, the second interconnect layer 5 is formed in a three-stage process by deposition of a first AlCu layer, a following AlGeCu layer, and a following second AlCu layer. The processes, in particular, for forming the AlGeCu layer in the fourth embodiment case again correspond to the embodiments described above, and consequently are not described in detail below. In addition to the first AlCu layer, according to the fourth embodiment, a further AlCu layer is superimposed as a covering layer for the AlGeCu layer. As a result, the layer resistance, the reliability of the interconnect, and the patterning properties are further improved. The individual layers may in the fourth embodiment be formed at different substrate temperatures, although it is preferable firstly to use a cold process followed by warmer processes at substrate temperatures that respectively lie below and above 100 degrees Celsius.

According to a further embodiment, the second interconnect layer is formed in a multi-stage process by deposition of at least one AlGeCu layer in the contact holes 3 followed by chemical mechanical polishing (CMP) and then deposition of an AlCu layer over the entire area of the surface of the insulation layer 2. Once again, the deposition processes used correspond to those described above, and, consequently, they are not described again in the text that follows. According to the further embodiment, the AlGeCu layer is situated only in the respective regions of the contact holes 3, while a remaining part of the surface is covered over its entire area with an AlCu layer. The result, once again, is optimum flow and filling properties at the contact holes 3 so as to produce highly reliable, void-free contacts, while the entire second interconnect layer 5 has a minimum film resistance. Furthermore, patterning by anisotropic etching processes is improved further because the AlCu layer formed on the insulation layer 2 has minimum film resistances and smaller grain sizes, therefore, allowing finer patterning.

The anisotropic etching process used to pattern the second interconnect layer 5 is preferably reactive ion etching (RIE). As such, it is possible for the process described above to be incorporated without problems into existing processes. Furthermore, to improve materials properties in all the embodiments described above, it is additionally possible to carry out a heat treatment. To improve the patterning of the second interconnect layer 5, the antireflection layer 6 preferably is made of a TiN layer, with the result of reducing, in a controlled way, the light scatterers that cause problems, in particular, when using photolithography patterning processes.

The invention has been described based on a first and a second interconnect layer. However, these first and second interconnect layers are not restricted to a first and second metallization level, but rather can be applied to all interconnect levels within an integrated circuit or a semiconductor component. In particular, the use of a special low-temperature PVD sputtering process results in an AlGeCu layer with small grains and minimum precipitation. Consequently, the layer can be patterned directly in a subsequent patterning step. A high-quality, reliable interconnect can, thus, be produced particularly easily and inexpensively.

We claim:

1. A process for fabricating an interconnect for contact holes, which comprises:
   a) forming contact holes in an insulation layer leading to a first interconnect layer, the insulation layer having an insulation surface, the contact holes having a hole surface;
   b) cleaning the hole surface;
   c) forming a barrier layer at least on the hole surface;
   d) forming an AlGeCu-containing second interconnect layer on the insulation surface in a three-stage process by depositing a first AlCu layer, an AlGeCu layer, and a second AlCu layer using a low-temperature PVD process to fill up the contact holes;
   e) forming and patterning a mask layer on the second interconnect layer; and
   f) patterning the second interconnect layer by an anisotropic etching process using the mask layer.

2. The process according to claim 1, which further comprises performing the second interconnect layer forming step by forming the second interconnect layer in a single-stage process by depositing an AlGeCu layer at a substrate temperature of >100 degrees Celsius.

3. The process according to claim 1, which further comprises performing the second interconnect layer forming step by forming the second interconnect layer in a single-stage process by depositing an AlGeCu layer at a substrate temperature between 100 and 420 degrees Celsius.

4. The process according to claim 1, which further comprises performing the second interconnect layer forming step by forming the second interconnect layer in a two-stage process by depositing a first AlGeCu layer at a substrate temperature of between 0 and 100 degrees Celsius and depositing a second AlGeCu layer at a substrate temperature of between 100 and 420 degrees Celsius.

5. The process according to claim 1, which further comprises performing the second interconnect layer forming step by forming the second interconnect layer in a two-stage process by depositing a first AlGeCu layer at a substrate temperature of <100 degrees Celsius and depositing a second AlGeCu layer at a substrate temperature of >100 degrees Celsius.

6. The process according to claim 1, which further comprises performing the second interconnect layer forming step by forming the second interconnect layer in a two-stage process by depositing an AlCu layer at a substrate temperature of <100 degrees Celsius and depositing an AlGeCu layer at a substrate temperature of >100 degrees Celsius.

7. The process according to claim 1, which further comprises performing the second interconnect layer forming step by forming the second interconnect layer in a two-stage process by depositing an AlCu layer at a substrate temperature of between 0 and 100 degrees Celsius and depositing an AlGeCu layer at a substrate temperature of between 100 and 420 degrees Celsius.

8. The process according to claim 1, wherein the second interconnect layer forming step includes subjecting the second interconnect layer including at least one of the contact holes to a final heat treatment.

9. The process according to claim 1, which further comprises performing the second interconnect layer forming step by forming the second interconnect layer in a multi-stage process by depositing at least one AlGeCu layer in the contact holes, followed by planarizing by chemical mechanical polishing, and by depositing an AlCu layer over an entire area of the insulation surface.

10. The process according to claim 1, which further comprises performing the cleaning step by wet-chemical cleaning.

11. The process according to claim 1, which further comprises performing the cleaning step by a plasma-etching process.

12. The process according to claim 1, which further comprises performing the cleaning step by at least one of wet-chemical cleaning and a plasma-etching process.

13. The process according to claim 1, which further comprises performing the barrier layer forming step by forming a Ti adhesion layer as the barrier layer.

14. The process according to claim 1, wherein the second interconnect layer has a second interconnect surface and which further comprises forming, before the mask layer forming and patterning step, an antireflection layer on the surface of the second interconnect layer.

15. The process according to claim 14, which further comprises forming, before the mask layer forming and patterning step, a TiN layer on the surface of the second interconnect layer.

16. The process according to claim 1, which further comprises performing the second interconnect layer forming step by using a Ge-containing AlCu target to form the second interconnect layer.

17. The process according to of claim 1, which further comprises performing the patterning step by reactive ion etching.

18. The process according to claim 1, which further comprises applying the method steps (a) to (f) for fabricating all interconnects for contact holes within an integrated circuit or semiconductor component.

19. The process according to claim 1, wherein the formed AlGeCu-containing second interconnect layer has sufficiently small grain sizes to enable direct patterning by the anisotropic etching process without the need of a chemical-mechanical polishing step.

* * * * *